(12) United States Patent
Nakata et al.

(10) Patent No.: US 10,217,883 B2
(45) Date of Patent: Feb. 26, 2019

(54) FUNCTIONAL YARN EQUIPPED WITH SEMICONDUCTOR FUNCTIONAL ELEMENTS

(71) Applicant: SPHELAR POWER CORPORATION, Kyoto-shi, Kyoto (JP)

(72) Inventors: Josuke Nakata, Kyoto (JP); Hidetoshi Nakamura, Kyoto (JP); Atsuji Masuda, Fukui (JP); Takahiro Tsuji, Fukui (JP); Norio Sasaguchi, Fukui (JP)

(73) Assignee: Sphelar Power Corporation, Kyoto (JP)

(*) Notice: Subject to any disclaimer, the term of this patent is extended or adjusted under 35 U.S.C. 154(b) by 159 days.

(21) Appl. No.: 15/127,364

(22) PCT Filed: Mar. 19, 2014

(86) PCT No.: PCT/JP2014/057450
§ 371 (c)(1),
(2) Date: Sep. 19, 2016

(87) PCT Pub. No.: WO2015/140948
PCT Pub. Date: Sep. 24, 2015

(65) Prior Publication Data
US 2017/0133532 A1    May 11, 2017

(51) Int. Cl.
*H01L 31/0352* (2006.01)
*H01L 31/05* (2014.01)
*H01L 31/0224* (2006.01)

(52) U.S. Cl.
CPC .. *H01L 31/035281* (2013.01); *H01L 31/0504* (2013.01); *H01L 31/022425* (2013.01); *Y02E 10/50* (2013.01)

(58) Field of Classification Search
CPC ......... H01L 31/035281; H01L 31/0504; H01L 31/042
See application file for complete search history.

(56) References Cited

U.S. PATENT DOCUMENTS

| 6,093,884 | A | * | 7/2000 | Toyomura | ............... | E04D 3/366 126/621 |
| 2002/0020440 | A1 | * | 2/2002 | Yoshimine | ........ | B32B 17/10018 136/251 |

FOREIGN PATENT DOCUMENTS

| JP | 09-162434 A | 6/1997 |
| JP | 5138976 B2 | 2/2013 |

(Continued)

OTHER PUBLICATIONS

Machine translation of WO2013/076794, pub. May 2013.*

*Primary Examiner* — Allison Bourke
(74) *Attorney, Agent, or Firm* — Norris McLaughlin, P.A.

(57) ABSTRACT

Functional yarn equipped with semiconductor functional elements includes: a plurality of semiconductor functional elements whose electrically conductive directions defined by positive and negative electrodes are aligned and disposed between a pair of conducting wires in which each of the positive electrodes being connected to the conducting wire and each of the negative electrodes being connected to the conducting wire; an element mounting region consisting of conducting wire portions on which a plurality of the semiconductor functional elements are disposed; a conducting wire region consisting of only conducting wire portions and an insulating member that covers the surface of at least one of the pair of conducting wire portions of the conducting wire region.

5 Claims, 3 Drawing Sheets

(56) References Cited

FOREIGN PATENT DOCUMENTS

WO     2005/041312 A1    5/2005
WO     2013/076794 A1    5/2013

* cited by examiner

FUNCTIONAL YARN EQUIPPED WITH SEMICONDUCTOR FUNCTIONAL ELEMENTS

BACKGROUND OF THE INVENTION

The present invention relates to a functional yarn equipped with semiconductor functional elements, and in particular relates to such a functional yarn that includes a plurality of semiconductor functional elements which are formed as granules, and a pair of conducting wires that are flexible and to which the plurality of semiconductor functional elements are connected in parallel.

In the prior art, in the field of manufactured textile products, a manufactured textile (i.e. a built-up mass made from textile) has been proposed to which are attached semiconductor functional elements of various types having a function of light reception or a function of light emission. In this type of manufactured textile with attached semiconductor functional elements, for example, functional yarns in the form of cords on which are mounted a plurality of semiconductor functional elements (solar cells, light emitting diodes, bypass diodes, or the like) are used as warp or weft and a plurality of conducting wires or insulating wires are used as weft or warp, and these are woven or braided together.

However, there has been the problem with the functional yarn equipped with semiconductor functional elements described above that, due to tension being applied to the wire members before processing into a textile, or due to distortion or deformation stress on the manufactured textile after processing into a textile, it may become impossible for the light reception function or the light emission function of the semiconductor functional elements to be manifested, because the pairs of conducting wires of the functional yarns equipped with semiconductor functional elements may undesirably come into mutual contact, thus causing an electrical short circuit.

Thus, in order to solve the problem described above, for example, in JP Patent 5,138,976 there is disclosed a functional yarn equipped with semiconductor functional elements in which a plurality of semiconductor functional elements formed as granules having positive and negative electrodes at their opposite ends are sandwiched between a pair of conducting wires to which they are electrically connected in parallel, and these semiconductor functional elements and the pair of conducting wires are completely embedded in flexible transparent synthetic resin, with the cross section of the resulting product being circular.

SUMMARY OF THE INVENTION

However, with a construction like that of the functional yarn equipped with semiconductor functional elements of JP Patent 5,138,976 in which the plurality of semiconductor functional elements and the pair of conducting wires are completely covered with synthetic resin, when establishing electrical connection in series or in parallel partway along the conducting wire direction between one functional yarn equipped with semiconductor functional elements and another functional yarn equipped with semiconductor functional elements, since it is difficult to establish connection between the functional yarns equipped with semiconductor functional elements due to the impediment provided by the synthetic resin, accordingly it is not easy to perform adjustment of the generated current or the generated voltage, so that there is the problem that it is not possible to utilize the beneficial aspects of the functional yarn equipped with semiconductor functional elements in an effective manner.

Moreover, since the functional yarn equipped with semiconductor functional elements becomes thicker when the functional yarn equipped with semiconductor functional elements is completely covered with synthetic resin, accordingly its flexibility as a wire material is undesirably reduced. Due to this, after the functional yarn equipped with semiconductor functional elements has been used as a weft and an insulating yarn has been used as the warp, for example, and these have been processed into a textile, the flexibility and the expansion characteristic of the manufactured textile are lost, which is undesirable. In other words, there is the problem that, the more the amount of covering with synthetic resin upon the functional yarn equipped with semiconductor functional elements increases, the more difficult it becomes to realize its function as a normal yarn material.

Furthermore, if processing into a textile is performed in the state in which the functional yarn equipped with semiconductor functional elements is not covered with synthetic resin, then, as described above, there is the problem of undesirable short circuiting between conducting wire portions within the pair of conducting wires of the functional yarn equipped with semiconductor functional elements on which semiconductor functional elements are not arranged.

The objective of the present invention is to provide a functional yarn equipped with semiconductor functional elements having a construction with which, even after having been processed into a textile, it is possible to establish electrical connection between adjacent ones of the functional yarns equipped with semiconductor functional elements in a simple and easy manner, and moreover having a construction with which, even after having been processed into a textile, the flexibility and expansion characteristics are not lost, and so on.

The functional yarn equipped with semiconductor functional elements according to the present invention comprises a plurality of semiconductor functional elements formed as granules and having positive and negative electrodes at their opposite ends, and a pair of flexible conducting wires to which the plurality of semiconductor functional elements are connected in parallel, with the plurality of semiconductor functional elements being arranged so that their electrically conductive directions defined by their positive and negative electrodes are aligned between the pair of conducting wires arranged in a parallel state, and being formed as a cord in which, along with the positive electrodes of the plurality of semiconductor functional elements being electrically connected to one of the conducting wires via electrically conductive joining material, the negative electrodes of the plurality of semiconductor functional elements are electrically connected to the other of the conducting wires via electrically conductive joining material, and is characterized by comprising: an element mounting region comprising the plurality of semiconductor functional elements, and conducting wire portions within the pair of conductive wires on which the plurality of semiconductor functional elements are arranged; and a conducting wire region comprising only conducting wire portions within the pair of conductive wires excluding the element mounting region; and in that a surface of at least one of the pair of conducting wire portions of the conducting wire region is covered by an insulating member.

According to the present invention, since the conducting wire portions in the element mounting region are not processed so as to be insulated, accordingly it is possible to implement a functional yarn equipped with semiconductor functional elements with which, even after processing the yarn into a textile, it is possible simply and easily to establish electrical connections between adjacent ones of the functional yarns. And, since the conducting wire portions in the conducting wire region are processed to be insulated, accordingly it is possible to implement a functional yarn equipped with semiconductor functional elements with which it is possible to prevent electrical short circuiting due to contact between the pair of conducting wires. Moreover, since the line width of the conducting wire region in the electrically conductive direction is set to be smaller than the line width of the element mounting region in the electrically conductive direction, accordingly it is possible to implement a functional yarn equipped with semiconductor functional elements in which the characteristics of flexibility and expansion are not lost, even after the yarn has been processed into a textile.

In addition to the structure of the present invention detailed above, it would also be acceptable to arrange to employ various additional structures, as follows.

(a) The insulating member may be formed by shrinking a heat shrinkable tube installed over the conducting wire portion.

(b) The insulating member may be formed by applying and heat-hardening a thermosetting resin on the conducting wire portion.

(c) The surfaces of both of the pair of conducting wire portions of the conducting wire region may be covered with insulating members having different colors.

(d) The line width of the conducting wire region in the electrically conductive direction that is covered by the insulating member may be set to be smaller than the line width of the element mounting region in the electrically conductive direction.

DETAILED DESCRIPTION OF THE INVENTION

The present invention will now be described in detail on the basis of embodiments.

First, the overall construction of a functional yarn 1 equipped with semiconductor functional elements will be explained.

As shown in FIGS. 1 through 4, the functional yarn 1 equipped with semiconductor functional elements is made as a flexible cord, and comprises a plurality of semiconductor functional elements 2 that are formed as small granules having positive and negative electrodes 2a, 2b at opposite sides, and a pair of conducting wires 3a, 3b to which the plurality of semiconductor functional elements 2 are connected in parallel.

Figure 3:
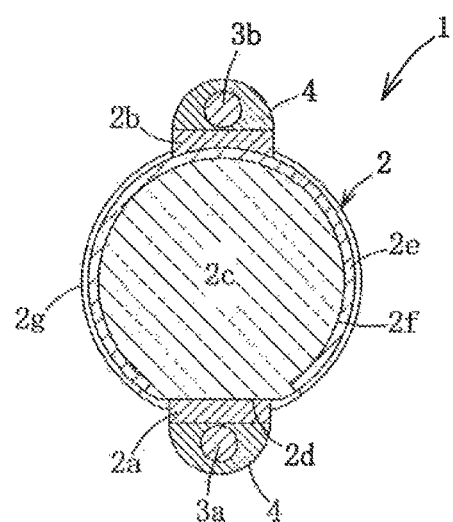
FIG. 3 is a sectional view of the functional yarn equipped with semiconductor functional elements.

As shown in FIG. 3, the semiconductor functional elements 2 are built as spherical solar cells 2. In other words, each of the spherical solar cells 2 is manufactured by using a spherical p type silicon single crystal 2c of diameter 1.0 to 2.0 mm (in this embodiment, the diameter is 1.2 mm). A flat surface 2d is formed on one portion of the surface of this p type silicon single crystal 2c, and a n type diffused layer 2e is formed by an n type impurity being diffused into the greater portion of the spherical surface of the crystal except for the flat surface 2d and the neighboring portion, so that a pn junction 2f that is shaped as a spherical surface is formed at a position around 1 µm from the surface of the n type diffused layer 2e.

A positive electrode 2a (i.e. an anode electrode) made from a silver alloy with added aluminum is spot-connected at low resistance to the flat p type surface 2b (i.e. at one end of the spherical solar cell 2), and a negative electrode 2b (i.e. a cathode electrode) made from a silver alloy with added antimony is spot-connected at low resistance to the n type surface on the opposite side to the positive electrode 2a with respect to the center of the p type silicon single crystal 2c (i.e. at the other end of the spherical solar cell 2). And a reflection prevention layer 2g consisting of a transparent $SiO_2$ layer is formed over the entire surface of the p type silicon single crystal 2c and the n type diffusion layer 2e, except for these positive and negative electrodes 2a, 2b.

This spherical solar cell 2 is capable of receiving light from all directions, except from its electrically conductive direction joining the positive and negative electrodes 2a, 2b. Due to this, the cell 2 is capable of receiving incident light directly even if the direction in which the light is incident is fluctuating; it is capable of receiving light, including reflected light, from any direction; and it is capable of maximizing the efficiency of utilization of light that enters into the vicinity of the spherical solar cell 2. It should be understood that the electrically conductive direction of the spherical solar cell 2 is the direction that, together with being parallel to the plane that includes the pair of conducting wires 3a, 3b, is also orthogonal to the pair of conducting wires 3a, 3b.

The pair of conducting wires 3a, 3b are arranged in a parallel state with a predetermined gap being left between them (which is approximately the same as the diameter of the spherical solar cells 2). The outer surfaces of the positive electrodes 2a of the plurality of solar cells 2 are all electrically connected to the conducting wire 3a with electrically conductive joining material 4, and the outer surfaces of the negative electrodes 2b of the plurality of solar cells 2 are all electrically connected to the conducting wire 3b with electrically conductive joining material 4.

The material of the conducting wires 3a, 3b is not necessarily particularly limited: provided that they are made as electrically conductive wires, they could be manufactured from common aluminum wire or copper wire, or as a filament made from a single line, or a bundled together or twisted together plurality of lines, whose material is selected from among glass fiber, carbon fiber, polyester fiber, aramid fiber, polyethylene fiber, or liquid crystal polymer fiber, with the surface thereof being covered with one or a plurality of thin metallic wires in coil form. Moreover, it would also be acceptable for them to be electrically conductive wire members consisting of glass fiber, silica fiber, basalt fiber, carbon fiber, polyester fiber, polyimide fiber, aramid fiber, or liquid crystal polymer fiber, upon which plating with metal has been performed.

While the diameter of the conducting wires 3a, 3b is around 0.3 mm, it should be understood that, in order for the light incident upon the spherical solar cells 2 to be received with good efficiency, it is desirable for this diameter to be set to approximately 1/10 to 1/15 times the diameter of the spherical solar cells 2. Moreover, it is desirable for the conducting wires 3a, 3b to be resistant to temperatures of 150° or more, in order for them to be connected to the spherical solar cells 2 by applying the electrically conductive joining material 4 to their portions that contact the spherical solar cells 2 and by hardening the material 4 with heat. Moreover, in consideration of the consumption of electrical power due to electrical resistance, it is desirable for the electrical resistance of the conducting wires 3a, 3b to be in the range of 0.001 to 20 Ω/m.

The electrically conductive joining material 4 may, for example, be electrically conductive epoxy resin (a mixture of silver powder in epoxy resin). When the spherical solar cells 2 are to be fixed between the pair of conductive wires 3a, 3b, electrically conductive epoxy resin is applied to the contact portions of the conducting wires 3a, 3b and to the positive and negative electrodes 2a, 2b of the spherical solar cells 2, heat is applied to this electrically conductive epoxy resin so that it is hardened, and thereby the spherical solar cells 2 are fixed to the pair of conductive wires 3a, 3b.

Next, conducting wire regions 12 and element mounting regions 11 will be explained.

Figure 1:
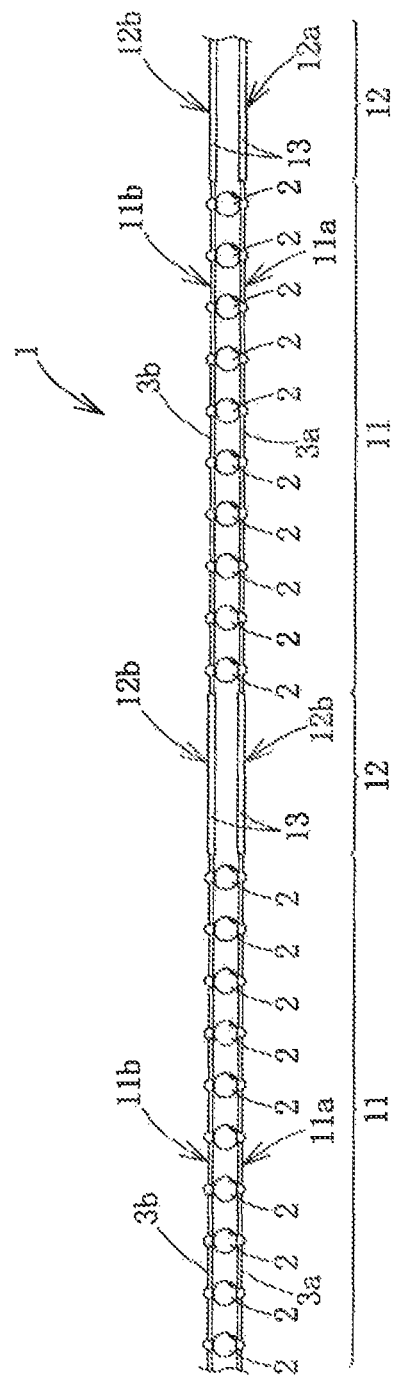
FIG. 1 is a plan view of a functional yarn equipped with semiconductor functional elements according to an embodiment of the present invention.
Figure 2:
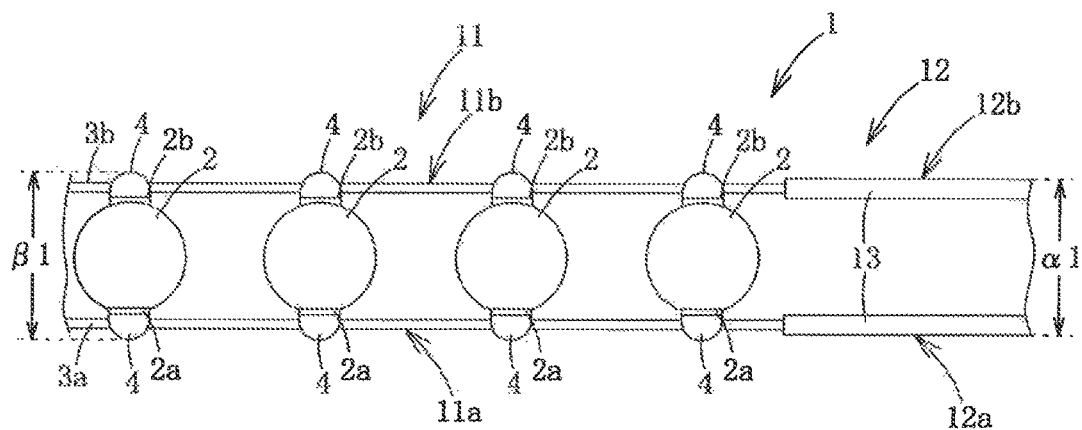
FIG. 2 is an enlarged plan view of a portion of FIG. 1.
Figure 4:
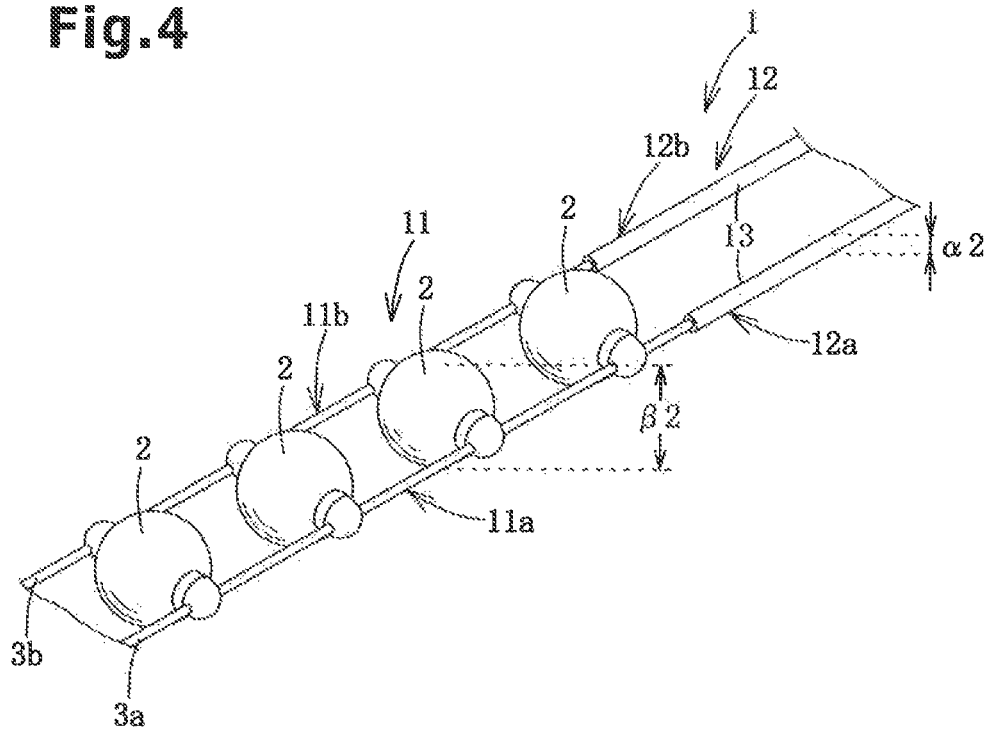
FIG. 4 is a partial perspective view of the functional yarn equipped with semiconductor functional elements.

As shown in FIGS. 1,2, and 4, this functional yarn 1 equipped with semiconductor functional elements comprises, element mounting regions 11 comprising a plurality of spherical solar cells 2 and conducting wire portions 11a, 11b of the pair of conducting wires 3a, 3b in each of which a plurality of the spherical solar cells 2 are arranged, and conducting wire regions 12 excluding the element mounting regions 11 which are consisting only of conducting wire portions 12a, 12b, with these element mounting regions 11 and conducting wire regions 12 being formed repeatedly in a plurality of groups in series along the length direction of the conducting wires 3a, 3b. It should be understood that, in the functional yarn 1 equipped with semiconductor functional elements shown in FIG. 1, among all of the element mounting regions 11 and conducting wire regions 12, only a couple of each are shown.

In the element mounting region 11, a plurality of the spherical solar cells 2 are arranged with their electrically conductive directions defined by their positive and negative electrodes 2a, 2b being aligned orthogonal to the conducting wires 3a, 3b between the pair of conducting wires 3a, 3b which are disposed in parallel, and the positive electrodes 2a of the plurality of spherical solar cells 2 are electrically connected to one of the conducting wires 3a, while the negative electrodes 2b of the plurality of spherical solar cells 2 are electrically connected to the other conducting wire 3b. Set gaps (for example, gaps roughly equal to the diameter of the spherical solar cells 2) are left between adjacent ones of the spherical solar cells 2.

The conducting wire regions 12 are provided at both end portions of the functional yarn 1 equipped with semiconductor functional elements in the direction of the conducting wires, and between the element mounting regions 11, etc. The surface of at least one of the pair of conducting wire portions 12a, 12b of each of the conducting wire regions 12 is covered with an insulating member 13. In detail, in this embodiment, the surfaces of both of the pair of conducting wire portions 12a, 12b of each of the conducting wire regions 12 are covered with insulating members 13.

Each of the insulating members 13 is formed by contracting a heat shrinkable tube that has been installed over the conducting wire portion 12a or 12b. The heat shrinkable tube is made from a synthetic resin, the most common of which is polyethylene, and in general is not subject to damage by conventional resin processing and so on, since it is resistant to organic solvents such as alcohols, acetone, toluene and the like, and to aqueous solutions of acids and alkalis. In other words, it is possible to perform conventional resin processing upon a manufactured textile that is made by using the functional yarn 1 equipped with semiconductor functional elements. Moreover, since the specific gravity of such a heat shrinkable tube is lower than unity, accordingly it is also possible to make such a manufactured textile that is made by using the functional yarn 1 equipped with semiconductor functional elements to be light in weight.

Incidentally, even when the pair of conducting wire portions 12a, 12b are covered with conventional heat shrinkable tube, since the flexural rigidity thereof is around 1.152 gf·cm²/cm and is less than 2.0 g·cm²/cm, accordingly, during processing into textile, it can be handled as easily as a normal yarn material. Moreover, it is possible to ensure that the conducting wire regions 12 have sufficient flexibility even after processing into textile.

It should be understood that the insulating members 13 are not necessarily limited to being made with heat shrinkable tube; it would also be possible to form these members by applying thermosetting resin to the conducting wires 3a, 3b and hardening that resin with heat. In other words, it would also be acceptable to use, for example, an insulating varnish (such as silicone, epoxy, or the like) for the insulating members 13. In the functional yarn 1 equipped with semiconductor functional elements, the conducting wires 3a, 3b are covered with the insulating members 13 by coating or impregnating them with insulating varnish in liquid form, and by hardening that varnish by applying heat with an infrared lamp or the like only to the regions where insulation is required (i.e. to the conducting wire regions 12)

If an insulating varnish is used for the insulating members 13, then this insulating varnish may be coated in a thin layer. Since it is possible to make the conducting wire regions 12 of size equal to or smaller than the element mounting regions 11 in a simple manner, accordingly this yarn can be handled in the same way as a normal yarn material, and processing thereof can be performed continuously and automatically by weaving or knitting processing. Furthermore, the durability in relation to curving and stretching deformation is also enhanced. The insulating members 13 can be varied as appropriate by using material that is flexible, or elastic, or stretchable.

Next, the size relationship between the element mounting regions 11 and the conducting wire regions 12 will be explained.

As shown in FIG. 4, the line width a1 in the electrically conductive direction of the conducting wire regions 12 that are covered by the insulating members 13 is set so as to be smaller than the line width β1 in the electrically conductive direction of the element mounting regions 11. That is, by setting the line width α1 of the conducting wire regions 12 including the thickness of the insulating members 13 to, on average, around 1.74 mm (and to a maximum of 1.84 mm) while setting the line width β1 in the electrically conductive direction of the element mounting regions 11 including the electrically conductive joining material 4 to an average of around 1.84 mm, the size of the conducting wire regions 12 is set so as to become equal or less than the size of the element mounting regions 11.

It should be understood that, in the construction in which the spherical solar cells 2 are implemented in the element mounting regions 11, the height α2 of the conducting wire regions 12 that are covered by the insulating members 13 in the height direction orthogonal to the electrically conductive direction of the spherical solar cells 2 and moreover orthogonal to the plane that includes the pair of conducting wires 3a, 3b becomes equal to or lower than the height β2 of the element mounting regions 11 (i.e. the diameters of the spherical solar cells 2).

By setting the size of the conducting wire regions 12 (i.e. their width in the electrically conductive direction) so as to be equal to or less than the size of the element mounting regions 11 (i.e. their width in the electrically conductive direction), it is ensured that the conducting wire regions 12 do not become thicker than the element mounting regions 11. Accordingly, since it is possible to use the functional yarn 1 equipped with semiconductor functional elements in a similar manner to the use of a conventional yarn material when processing is being performed to form it into a textile (by a weaving process or a knitting process), accordingly it is possible to form this yarn into a textile continuously and automatically. And it is possible to implement a functional yarn 1 equipped with semiconductor functional elements which does not lose its flexibility and its expansion characteristics even after having been processed into a textile.

Next, the operation and the beneficial effects of the functional yarn 1 equipped with semiconductor functional elements according to the present invention will be explained.

In a stage in which processing into a textile is performed using a general purpose fiber as the warp and a general purpose fiber and the above functional yarn 1 equipped with semiconductor functional elements as the weft, although pressure due to tensioning and rolling and so on, and curving and expansion deformation within the manufactured textile, take place, since the conducting wire portions 12a, 12b are processed to be insulated, accordingly it is possible to prevent short circuiting due to electrical contacting between adjacent conducting wires 3a, 3b, and so it is possible to perform processing into a textile in a state in which the light reception function and the light emission function and so on are reliably maintained.

Moreover, since the conducting wires 3a, 3b and the electrically conductive joining material 4 of the element mounting regions 11 are not covered over, accordingly it is possible to establish electrical connection between adjacent ones of the functional yarns in a simple manner, even in the textile state. Accordingly, it is possible to arrange for any desired electricity generation performance (or light emission performance) by adjusting the series connection and the parallel connection in the manufactured textile between the functional yarns 1 equipped with semiconductor functional elements.

According to this functional yarn 1 equipped with semiconductor functional elements, when light is incident upon the functional yarn 1 equipped with semiconductor functional elements and this light is irradiated on the plurality of spherical solar cells 2 whose polarities are aligned, without any relationship with the direction in which the light is incident, the light is received by the pn junctions 2f that are formed as almost spherical surfaces in the spherical solar cells 2, and is converted into electrical energy by the photovoltaic power generation function (i.e. the light reception function) of the spherical cells 2.

The electrical energy resulting from this conversion is outputted to the exterior from the positive and negative electrodes 2a, 2b that face one another across the center of the spherical solar cell 2 and that are connected to the two poles of the pn junction 2f, and through the conducting wires 3a, 3b. And, upon receipt of light, the functional yarn 1 equipped with semiconductor functional elements outputs an output voltage of around 0.6 V. The magnitude of the current outputted by the functional yarn 1 equipped with semiconductor functional elements is proportional to the number of spherical solar cells 2.

In other words, with a manufactured textile that has been made by using the functional yarn 1 equipped with semiconductor functional elements, the voltage of the generated electricity may be set freely via the number of elements that are connected in series, and the current of the generated electricity may be set freely via the number of elements that are connected in parallel. If, during production of the manufactured textile, a plurality of the functional yarns 1 equipped with semiconductor functional elements are connected in series and in parallel, then, even if some portions come to be partially in shadow, still it is possible to keep the influence on the output of the spherical solar cells 2 of the other portions that are not shaded to a minimum. Moreover, with this manufactured textile, it is possible to receive light at the same efficiency on both upper and lower sides thereof.

This functional yarn 1 equipped with semiconductor functional elements can be manufactured continuously in the form of long yarn. The number of spherical solar cells 2 (i.e. of semiconductor functional elements 2) in each element mounting region 11, the size of the spherical solar cells 2, and the gaps between adjacent ones of the spherical solar cells 2, can be set appropriately according to the specification.

It should be understood that it is desirable for the gap that is set between adjacent ones of the spherical solar cells 2 to be greater than or equal to a half and moreover less than or equal to twice the width of the spherical solar cells 2. By having this set gap, it is possible to ensure the optical transparency and the flexibility of the functional yarn 1 equipped with semiconductor functional elements, and moreover it is possible to set the space for disposing the warp or the weft that intersects this functional yarn 1 equipped with semiconductor functional elements during processing into a textile.

A manufactured textile that has been made using this functional yarn 1 equipped with semiconductor functional elements is flexible, and it is possible to adjust its optical transparency (or its optical transmittivity) by adjusting the gaps between the spherical solar cells 2, and/or the mesh or the like consisting of the conducting wires 3a, 3b and the insulating fibers. And it is possible to make a manufactured textile that is equipped with a large quantity of the spherical solar cells 2, thereby enhancing the light reception performance of the manufactured textile. It should be understood that, if the spherical solar cells 2 used for the semiconductor functional elements 2 are replaced by light emitting diodes, then it is possible to enhance the light emitting performance.

Next, modified embodiments in which the concrete embodiment described above is partially altered will be explained.

Figure 5:
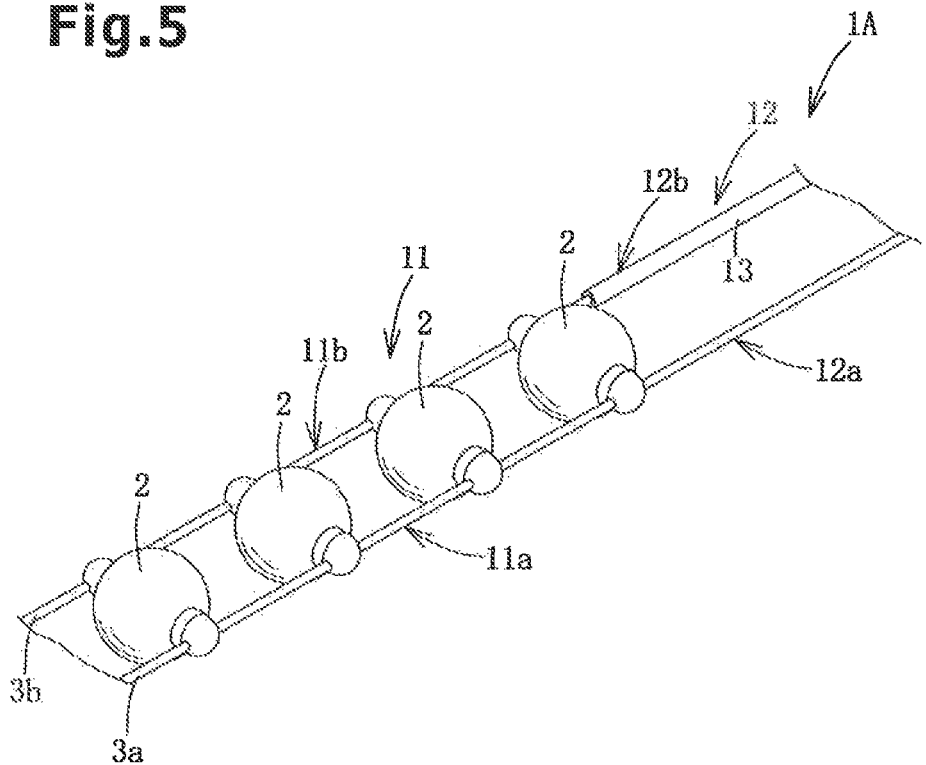
FIG. 5 is a partial perspective view of a functional yarn equipped with semiconductor functional elements according to a variant embodiment.

1) While, in the concrete embodiment described above, both surfaces of the pair of conducting wire portions 12a, 12b of the functional yarn 1 equipped with semiconductor functional elements were covered with the insulating members 13, the present invention is not particularly limited to this structure; as shown in FIG. 5, in the functional yarn 1A equipped with semiconductor elements, it would be sufficient to arrange for the surface of at least one of the pair of conducting wire portions 12a, 12b of the conducting wire region 12 (here, the conducting wire portion 12b) to be covered with an insulating member 13. According to this structure, along with preventing short circuiting due to electrical contact between adjacent ones of the conducting wires 3a, 3b, it is also possible to anticipate a reduction in cost due to reduction of the amount of material employed for the insulating members 13.

2) In the concrete embodiment described above, it would also be acceptable to cover the two surfaces of the pair of conducting wire portions 12a, 12b of the conducting wire region 12 with insulating members 13 whose colors are different. According to this structure, by using different colors for the heat shrinkable tube that covers the conducting wire 3a on the positive electrode side of the insulated region and for the heat shrinkable tube that covers the conducting wire 3b on the negative electrode side of the insulated region, even after processing into a textile has been performed, it becomes possible to determine simply and easily which are the positive electrodes in the manufactured textile and which are the negative electrodes.

3) In the concrete embodiment described above, if only the surface of one of the pair of conducting wire portions 12a, 12b of the conducting wire region 12 is covered with an insulating member 13 and is in an insulated state, it is possible to arrange to extract the generated electrical power from the other one of the conducting wire portions 12a, 12b upon which insulation is not provided.

In other words, when the conducting wire portions 12a on the positive electrode sides are not covered over, a manufactured textile may be made by weaving in a positive electrode power supply line so that it extends orthogonally to the functional yarns 1 equipped with semiconductor functional elements, and so that the positive electrode power supply line contacts the conducting wire portions 12a on the positive electrode sides of the plurality of functional yarns 1 equipped with semiconductor functional elements; and, when the conducting wire portions 12b on the negative electrode sides are not covered over, a manufactured textile may be made by weaving in a negative electrode power supply line so that it extends orthogonally to the functional yarns 1 equipped with semiconductor functional elements, and so that the negative electrode power supply line contacts the conducting wire portions 12a on the negative electrode sides of the plurality of functional yarns 1 equipped with semiconductor functional elements. According to this construction, it becomes possible to extract the electrical power that is generated by the manufactured textile at a single spot.

4) Apart from the above, for a person skilled in the art, it would be possible to implement the present invention in various ways that include various changes to the concrete embodiments described above, and the present invention is also to be considered as including such variants.

The functional yarn equipped with semiconductor functional elements described above, and a manufactured textile made from the functional yarn equipped with semiconductor functional elements, are light in weight and have excellent expansion characteristics. Thus, it becomes possible for such a manufactured textile to be installed on the outer surface of a building or on a vehicle body that has a curved surface shape. Moreover, in the building field, such a manufactured textile can also be widely employed for the roof or the wall of a membrane structure that is put under tension, or as a manufactured textile that is used for the purpose of shielding from sunlight, such as a tent or a shop type sunshade or the like; and it can be also applied in the interior field such as for curtains or blinds or the like, or in the vehicle field in an automobile, a train, or a ship, or in the sports field for outdoor wear, hats, or bags, or in the apparel field or the miscellaneous goods field for general wear or for caps and bags or the like. Furthermore, by being stored in a compact shape, for example by simple folding, this manufactured textile can also be used as a means for obtaining supply of power that may be required in a disaster scenario or the like.

The invention claimed is:

1. A functional yarn equipped with semiconductor functional elements, comprising a plurality of semiconductor functional elements formed as granules and having positive and negative electrodes at their opposite ends, and a pair of flexible conducting wires to which the plurality of semiconductor functional elements are connected in parallel, the plurality of semiconductor functional elements being arranged so that their electrically conductive directions defined by their positive and negative electrodes are aligned between the pair of conducting wires arranged in a parallel state, and being formed as a cord in which, along with the positive electrodes of the plurality of semiconductor functional elements being electrically connected to one of the conducting wires via electrically conductive joining material, the negative electrodes of the plurality of semiconductor functional elements are electrically connected to the other of the conducting wires via electrically conductive joining material, and further comprising:

each flexible conductive wire comprises a plurality of conductive wire portions between adjacent electrodes;
wherein at least one conductive wire portion is defined as a conductive wire region and a surface of the conductive wire region is covered by an insulating member; and
wherein a surface of at least one conductive wire portion is not covered by the insulating member.

2. The functional yarn equipped with semiconductor functional elements according to claim 1, wherein said insulating member is formed by shrinking a heat shrinkable tube installed over the conducting wire portion.

3. The functional yarn equipped with semiconductor functional elements according to claim 1, wherein the insulating member is formed by applying and heat-hardening a thermosetting resin on the conducting wire portion.

4. The functional yarn equipped with semiconductor functional elements according to claim 1, wherein the surface of the conducting wire region of each of the conducting wires of the pair of conducting wires is covered with the insulating member and each of the insulating members is of color different from that of the other.

5. The functional yarn equipped with semiconductor functional elements according to claim 1 wherein a line width of the conducting wire region in a electrically conductive direction that is covered by the insulating member is set to be smaller than a line width of the plurality of semiconductor functional elements in the electrically conductive direction.

* * * * *